United States Patent [19]

Sheade et al.

[11] Patent Number: 4,758,793
[45] Date of Patent: Jul. 19, 1988

[54] DETECTOR LOG VIDEO AMPLIFIER

[75] Inventors: Marc R. Sheade, Newark; Paul A. Murphy, Sunnyvale, both of Calif.

[73] Assignee: Raytheon Company, Lexington, Mass.

[21] Appl. No.: 13,100

[22] Filed: Feb. 10, 1987

[51] Int. Cl.⁴ .......................... G06G 7/24; H04B 1/16
[52] U.S. Cl. .................................. 328/145; 307/490; 333/81 R; 455/243
[58] Field of Search .................. 307/190; 328/145; 455/311, 334, 241-243; 333/81 R

[56] References Cited

U.S. PATENT DOCUMENTS

| | | | |
|---|---|---|---|
| 3,720,546 | 3/1973 | Chow et al. | 328/145 |
| 3,769,611 | 10/1973 | Scaggs | 328/145 |
| 3,916,193 | 10/1975 | Corte et al. | 328/145 |
| 4,691,381 | 9/1987 | Bollard | 328/145 |

OTHER PUBLICATIONS

"Application Note 80300: Characteristics of Semiconductor Limiter Diodes", *Specifications, Application Notes, Packages*, by Alpha Industries, Inc., Semiconductor Division, 1985, pp. 3-52, 3-53.

Primary Examiner—Stanley D. Miller
Assistant Examiner—B. P. Davis
Attorney, Agent, or Firm—Richard M. Sharkansky

[57] ABSTRACT

A Detector Log Video Amplifier (DLVA) comprising a first RF detector for detecting the power levels of received RF signals having power levels within a first range (e.g., −40 dBm to −20 dBm) and producing corresponding first video frequency signals having amplitudes representative thereof, from which are produced output signals having amplitudes logarithmically proportional to such received signals. A second RF detector detects the power levels of received RF signals having power levels within a second range (e.g., −20 dBm to +20 dBm) and produces corresponding second video frequency signals having amplitudes representative thereof, from which are produced output signals having amplitudes logarithmically proportional to such received signals. A control signal is produced from the second video frequency signals, the control signal having a level in accordance with the power levels of received RF signals. Received RF signals having power levels equal to or exceeding a first level (e.g., 0 dBm) are attenuated in accordance with the control signal level and coupled to the first detector. A limiter is responsive to the power levels of received RF signals exceeding a second level (e.g., +5 dBm) for limiting the power levels of such RF signals coupled to the attenuator in accordance with the power levels of such signals exceeding the second level. With such arrangement, the RF signals coupled to the first detector are prevented from exceeding the first level, thereby significantly reducing the DLVA's recovery time, for example to less than 500 nanoseconds.

25 Claims, 3 Drawing Sheets

DETECTOR LOG VIDEO AMPLIFIER

BACKGROUND OF THE INVENTION

The present invention relates to detector log video amplifiers and more particularly to detector log video amplifiers having improved recovery times.

As is known, a detector log video amplifier (DLVA) produces a video frequency output signal having an amplitude logarithmically proportional to the power level of a radio frequency (RF) signal applied to an input port thereof. An extended range DLVA responds to RF signals over a large power range, such as 60 dB (for example, between −40 dBm and +20 dBm). Conventional extended range DLVA's comprise a pair of RF detectors coupled in parallel to the input port of the DLVA and having differing operating RF power ranges. For example, the first detector may respond to RF power levels between −40 dBm and −20 dBm while the second detector responds to power levels between −20 dBm and +20 dBm. The pair of detectors produce video-frequency signals in response to the RF signals applied thereto. The video signals typically are amplified by a series of linear amplifiers, coupled through a set of logarithmic amplifiers, and combined in a summing amplifier to produce a video output signal having an amplitude proportional to the logarithm of the RF input signal power.

Typically, the RF signal is applied as a series of pulses to the input port of the DLVA. The recovery time of the DLVA is defined as the time interval between the falling edge of an initial video voltage output pulse produced in response to an initial RF input pulse and the rising edge of the next succeeding video voltage output pulse (produced in response to the next succeeding RF input pulse) with such next succeeding video pulse voltage being within a specified range (typically, ±0.5 dB) of its nominal voltage when the initial video pulse is not present. Recovery time increases with increasing DLVA RF input signal power and pulse width (up to about 10 µsec). Thus, in conventional DLVAs a directional coupler (e.g., a 20 dB coupler) is provided having an input coupled to the DLVA input port. The coupled path of the directional coupler is fed to the second RF detector (i.e., the detector responding to RF power levels between −20 dBm and +20 dBm at the DLVA input port), while the low-loss (i.e., throughput) path of the directional coupler is applied through an RF limiter to the input of the first RF detector (i.e., the detector responding to RF power levels between −40 dBm and −20 dBm at the DLVA input port). Thus, RF input pulses at the high end of the specified range (e.g., −40 dBm to +20 dBm) never exceed 0 dBm at the input of the second detector. The RF limiter responds to the power level of the DLVA RF input signal fed thereto via the directional coupler and typically begins attenuating such signal when the power level of such signal exceeds approximately +4 dBm, and limits the power level of the RF signal applied to the first RF detector as the power of the DLVA RF input signal further exceeds +4 dBm, thereby coupling an RF signal having a power level between +7 dBm and +12 dBm to the first RF detector when the RF signal at the DLVA input port has a +20 dBm power level.

While such a DLVA has performed satisfactorily and produced acceptable recovery times (for example, 10 µsec for +20 dBm, 1 µsec input pulses) in some applications, in other applications it is required to provide reduced recovery times from those achievable with such a DLVA. For example, to provide a recovery time of 1 microsecond (µsec) or less, power levels at each RF detector input cannot exceed 0 dBm for longer than 1 µsec. At such power level and duration, the RF detector and succeeding linear amplifiers are incapable of dissipating the excessive power applied thereto in less than 1 µsec after the initial RF pulse is removed, and a successive RF input pulse cannot be accurately processed by the DLVA until such power has been dissipated. As discussed, in the DLVA described above, the power applied to the first detector is as much as +7 dBm to +12 dBm at an RF input power of +20 dBm—far exceeding the 0 dBm threshold and thus increasing recovery time above 1 µsec.

One DLVA providing improved recovery times utilizes frequency compensation of the linear amplifiers to alter the frequency response of such amplifiers. With such arrangement, circuit components (i.e., the value of resistors, capacitors, etc.) are selected to reduce the DLVA recovery time (such as about 3 µsec for 1 µsec, +20 dBm input pulses) but such improved recovery time still exceeds that required in some applications (such as less than 1 µsec).

In another DLVA, an RF preamplifier is disposed at the input of the RF limiter, and an attenuator is inserted between the output of the RF limiter and the input of the first RF detector. The gain of the preamplifier and the loss of the attenuator are selected to be equal. Such arrangement limits the power level coupled to the first detector to less than 0 dBm, thereby reducing recovery time below 1 µsec. However, the preamplifier and attenuator reduce the "flatness" of the video output signal over the operating frequency range of the DLVA and also cause an increase in the current consumption of the DLVA.

SUMMARY OF THE INVENTION

In accordance with the present invention, a pair of radio frequency (RF) detectors are provided having input terminals coupled to an input port, and means, responsive to an output of a second one of the pair of RF detectors, produces a control signal in accordance with the power level of an RF signal at the input port. Means, disposed between the input port and the input terminal of a first one of the pair of RF detectors, couples the RF signal to the first RF detector and is responsive to the control signal for attenuating the level of the RF signal coupled to the first RF detector below a first predetermined power level as the power level of the RF signal at the input port equals or exceeds the first predetermined power level. A limiter is also provided, responsive to the power level of the RF signal at the input port, for limiting the power of the RF signal coupled to the attenuating means as the power level of the RF signal at the input port equals or exceeds a second predetermined level. With such arrangement, a detector log video amplifier (DLVA) is provided which prevents the power level of RF signals coupled to the first detector from exceeding the first predetermined power level, here 0 dBm, for the entire range of power levels over which the DLVA operates, such as between −40 dBm and +20 dBm. Thus, the recovery time of the DLVA is significantly reduced, for example to less than 500 nanoseconds. Such decreased recovery time is significantly lower than that provided in conventional DLVAs, and is achieved without the need of providing frequency compensation for DLVA components to alter the frequency response thereof, and without requiring additional preamplifiers and attenuators at the input of the first detector which tend to degrade the "flatness" of the video frequency output signals over the DLVA's operating frequency range and increase the current consumption of the DLVA.

In a preferred embodiment of the present invention, a DLVA is provided for receiving at an input port RF signals having power levels within a first range and for also receiving RF signals at the input port having power levels within a second range, the power levels in the second range (e.g., −20 dBm to +20 dBm) exceeding those in the first range (e.g., −40 dBm to −20 dBm). A first RF detector detects the power levels of received RF signals having power levels within the first range and produces corresponding first video frequency signals having amplitudes representative of such power levels. A second RF detector detects the power levels of received RF signals having power levels within the second range and produces corresponding second video frequency signals having amplitudes representative of such detected power levels. Means are responsive to the first video frequency signals for producing corresponding video frequency output signals having amplitudes proportional to the logarithms of the power levels of corresponding received RF signals within the first range of power levels, such means being further responsive to the second video frequency signals for producing corresponding video frequency output signals having amplitudes proportional to the logarithms of the power levels of corresponding received RF signals within the second range of power levels. Means are further provided for producing a control signal having a level in accordance with the power levels of received RF signals. Means, responsive to the control signal, attenuates received RF signals having power levels equal to or exceeding a first predetermined level (e.g., 0 dBm) in accordance with the level of the control signal and couples the attenuated RF signals to the first detector. A limiter is also provided, responsive to the power levels of received RF signals exceeding a second predetermined level (e.g., +5 dBm), for limiting the power levels of received RF signals coupled to the attenuating means in accordance with the power levels of the received RF signals exceeding the second predetermined level.

In accordance with an additional feature of the present invention, means are provided, having RF signals coupled thereto from an input terminal, for attenuating the power levels of such RF signals in accordance with the level of a control signal. Also provided are means, coupled between the input terminal and said attenuating means, for coupling RF signals from the input terminal to the attenuating means, such coupling means being responsive to RF signals at the input terminal having power levels exceeding a predetermined level, for limiting the power levels of the RF signals coupled to the attentuating means in accordance with the power levels of the RF signals at said input terminal having power levels exceeding said predetermined power level.

BRIEF DESCRIPTION OF THE DRAWINGS

The foregoing objects of the present invention and the features thereof may be fully understood from the following detailed description read in conjunction with the accompanying drawings wherein.

DESCRIPTION OF THE PREFERRED EMBODIMENT

Figure 1:
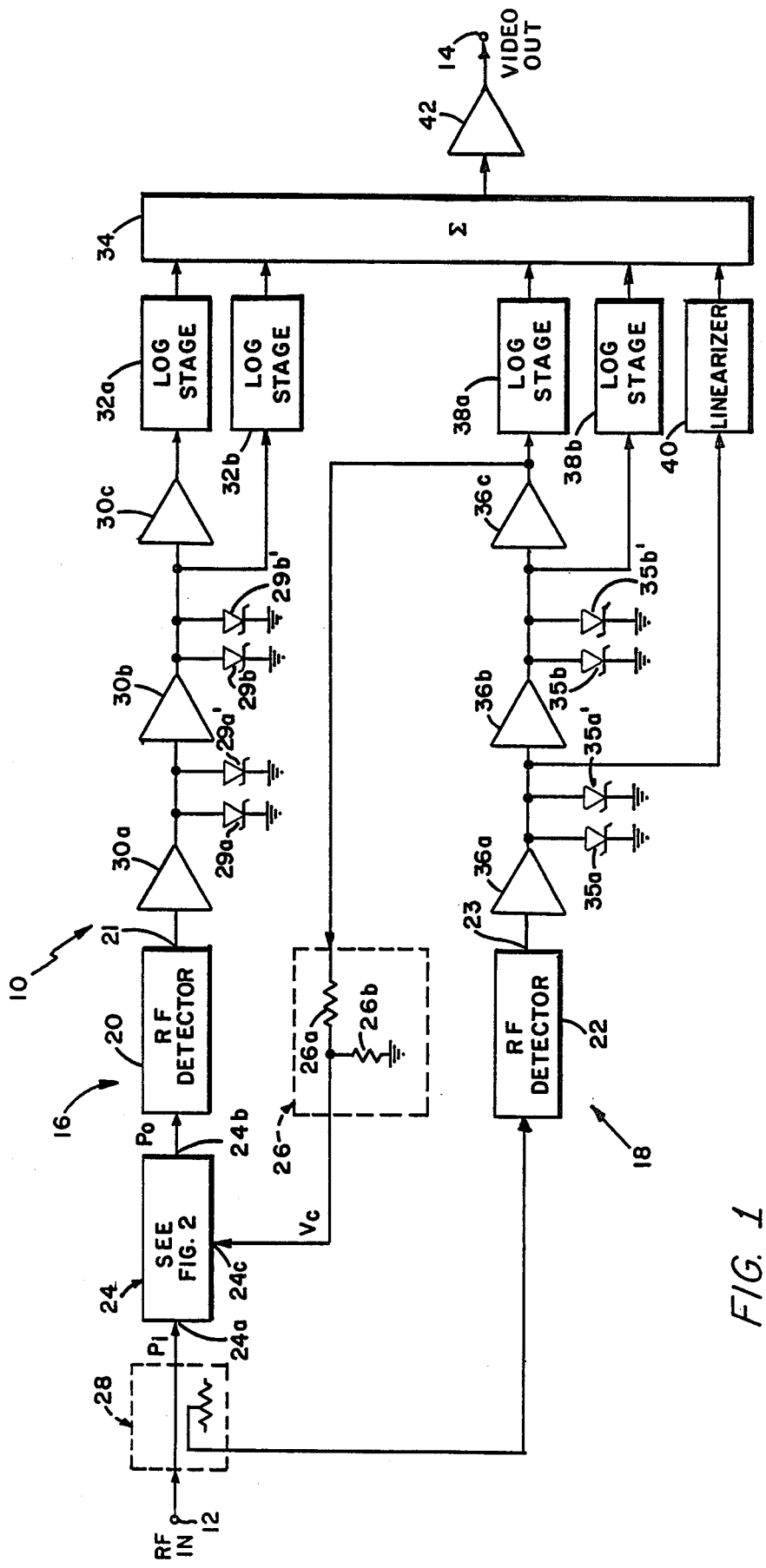
FIG. 1 is a block diagram of a detector log video amplifier (DLVA) according to the present invention.

Referring to FIG. 1, shown is a detector log video amplifier (DLVA) 10 for responding to radio frequency (RF) signals applied to an input port 12 thereof to produce at an output port 14 thereof video frequency signals having amplitudes proportional to the logarithms of the power levels of the applied RF signals. DLVA 10 comprises a pair of parellel channels or circuits 16, 18 coupled as shown between input and output ports 12, 14. First circuit 16 comprises first RF energy detector 20, responsive to RF signals applied to input port 12 having power levels within a first range of power levels (here, −40 dBm to −20 dBm), for detecting such RF signals and producing signals at terminal 21 thereof having amplitudes representative of the power levels of such RF signals. Second circuit 18 comprises second RF energy detector 22, responsive to RF signals at DLVA input port 12 having power levels within a second range of power levels (here, −20 dBm to +20 dBm), for detecting such RF signals and producing signals at terminal 23 thereof having amplitudes representative of the power levels of such RF signals. It is noted that here the power levels in the second range exceed those in the first range. DLVA 10 also comprises quasi-active limiter 24, disposed as shown between DLVA input port 12 and first RF detector 20, and control feedback circuit 26, electrically coupled between output terminal 23 of second RF detector 22 (here, via amplifiers 36a–36c) and such quasi-active limiter 24. The details and operation of quasi-active limiter 24 and control feedback circuit 26 are fully discussed hereinafter. Suffice it here to say that control feedback circuit 26 responds to the output of second RF detector 22 to produce a control signal having levels in accordance with the power levels of DLVA input signals. Quasi-active limiter 24 responds to such control signal to attenuate DLVA input signals having power levels equal to or exceeding a predetermined level (here, 0 dBm) in accordance with the levels of the control signal, and for coupling the attenuated RF signals to first detector 20. Quasi-active limiter 24 also responds to the power levels of DLVA input signals greater than a second predetermined level (here, +5 dBm) to impart limiting to such signals. With such arrangement, the power levels of RF signals coupled to first detector 20 are prevented from exceeding 0 dBm over the entire operating range (here, −40 dBm to +20 dBm) of DLVA 10, thus the recovery time of DLVA 10 is decreased below 1 μsec to as low as approximately 500 nanoseconds (nsec) for input power levels over such operating range.

First circuit or channel 16 additionally comprises coupler 28, here a 20 dB directional coupler, having an input port coupled to DLVA input port 12 and a throughput or low loss arm coupled to input 24a of quasi-active limiter 24, the output 24b of which is, as discussed, coupled to first RF detector 20. Here, DLVA 10 is a 50 ohm impedance circuit, and thus coupler 28, first RF detector 20 and quasi-active limiter 24 each have an impedance of 50 ohms. The output terminal 21 of first RF detector 20 is applied through a plurality of, here three, serially-coupled linear amplifiers 30a, 30b, 30c, with the output of linear amplifier 30c being coupled to logarithmic (log) stage 32a and the output of amplifier 30b being coupled to log stage 32b, as shown. A pair of log stages 32a, 32b are here used for illustration, greater or fewer log stages may be used. The outputs of log stages 32a, 32b are applied to summing section 34 for purposes to be discussed. A pair of Schottky diodes 29a, 29a', here 1N5711 diodes, are coupled in parallel to ground at the output of linear amplifier 30a, and a like pair of Schottky diodes 29b, 29b' are likewise coupled in parallel between the output of linear amplifier 30b and ground, for purposes to be discussed.

In second circuit or channel 18, the input of second RF detector 22 receives the coupled arm of directional coupler 28. Thus, it is noted that, here, an RF signal at DLVA input port 12 is attenuated by 20 dB at the input of second RF detector 22. Second RF detector 22 here also has a 50 ohm impedance. The output terminal 23 of second RF detector 22 is applied through a plurality of, here three, serially coupled, linear amplifiers 36a, 36b, 36c, although a greater or fewer number of such amplifiers may be used. The output of linear amplifier 36c is coupled to log stage 38a and to the input of control feedback circuit 26, as shown. The output of amplifier 36b is coupled to log stage 38b. Here, the output of amplifier 36a is applied to conventional linearizer 40. The outputs of log stages 38a, 38b and linearizer 40 are coupled to summing section 34, the output of which is applied via output amplifier 42 to DLVA output port 14. A pair of Schottky diodes 35a, 35a', here 1N5711 diodes, are coupled in parallel between the output linear amplifier 36a and ground, and a like pair of Schottky diodes 35b, 35b' are coupled in parallel from the output of linear amplifier 36b to ground, for purposes to be discussed.

In operation, DLVA 10 is an extended range detector log video amplifier, here responding to RF input signals within a 60 dB power level range, to produce video frequency output signals at port 14 logarithmically proportional to the power levels of the RF signals applied to input port 12. Here, the input RF power level range is from −40 dBm to +20 dBm. The RF signals applied to DLVA 10 here have a frequency in the 2-6 GHz range. First RF detector 20, here a commercially available device manufactured by Advanced Control Components of Clinton, N.J. 08809 as part number ACT1502N, responds to an RF signal at input port 12 having a power level between −40 dBm and −20 dBm (that is, a first range of power levels), to detect the power level of such signal and produce a video frequency output signal at terminal 21 thereof having an amplitude representative of the power of such RF signal. The video frequency output of first RF detector 20 is linearly amplified in amplifiers 30a-30c. Shunt Schottky diodes 29a, 29a', 29b, 29b' limit the amplitude of the output signals produced by amplifiers 30a, 30b, respectively, to ensure that successive amplifiers (i.e., amplifiers 30b, 30c, respectively) are not saturated thereby and operate in their linear range. Log stages 32a, 32b respond to the outputs of linear amplifiers 30c, 30b, respectively, to couple to summing section 34 signals logarithmically proportional to the amplitudes of the output signals of such amplifiers 30c, 30b. Such logarithmic signals are combined in summing section 34 to produce an output signal, which is amplified by output amplifier 42 and coupled to DLVA output port 14. Such output signal is a video frequency signal having an amplitude logarithmically proportional to the RF power level, within the −40 dBm to −20 dBm first range of power levels, of the RF signal present at DLVA input port 12.

RF signals applied to DLVA input port 12 having power levels between −20 dBm and +20 dBm (that is, a second range of power levels) are processed by second channel 18. Specifically, second RF detector 22, here a commercially available device, manufactured by Advanced Control Components of Clinton, N.J. 08809 as part number ACT1502N, responds to an RF signal at DLVA input port 12 having a power level between −20 dBm and +20 dBm to detect the power level of such RF signal and produce a video frequency output signal at terminal 23 having an amplitude representative of the power of such RF signal. It is noted that the power level at the RF signal coupled to second detector 22 is attenuated, here by 20 dB, by directional coupler 28 from that of the RF signal at DLVA input port 12. The output of second RF detector 22 is amplified in linear amplifiers 36-36c, the amplification factors of which are selected to take into account the 20 dB differential between the RF power level at input port 12 and at second RF detector 22. Shunt Schottky diodes 35a, 35a', 35b, 35b' limit the amplitudes of output signals produced by amplifiers 36a, 36b, respectively, to ensure that successive amplifiers (i.e., amplifiers 36b, 36c, respectively) are not saturated thereby and operate in their linear range. Log stages 38a, 38b produce signals logarithmically proportional to the outputs of linear amplifiers 36c, 36b, respectively. Summing section 34 combines the outputs of log stages 38a, 38b and produces an output signal which is amplified in output amplifier 42 and coupled to DLVA output port 14. Thus, DLVA 10, specifically second channel 18 thereof, produces a video frequency output signal at port 14 having an amplitude logarithmically proportional to the power level, between −20 dBm and +20 dBm, of an RF signal applied to DLVA input port 12.

Thus, it is seen that RF signals having power levels between −40 dBm and −20 dBm applied to DLVA input port 12, are detected and processed by first circuit or channel 16 to produce video frequency output signals at output port 14 having amplitudes logarithmically proportional to such power levels, while RF signals received at DLVA input port 12 and having greater power levels, here between −20 dBm and +20 dBm, are detected and processed by second channel 18 to produce video frequency output signals at DLVA output port 14 having amplitudes logarithmically proportional to such RF power levels. The constant of proportionality between the logarithms of the RF power levels and video frequency signal amplitudes is determined by the gains of summing section 34 and output amplifier 42. Linearizer 40, responding to the output of amplifier 36a, maintains the logarithmic response of DLVA 10 substantially linear over the full −40 dBm to +20 dBm range of the RF power levels applied to input port 12, as is known.

Typically, RF signals are applied to DLVA input port 12 as a series of RF pulses, with DLVA 10 producing corresponding video frequency signal pulses at output port 14. The recovery time of DLVA 10 is defined as the time interval between: the falling edge of a video frequency output pulse produced in response to a first RF input pulse; and, the rising edge of the next succeeding video frequency pulse produced by DLVA 10 in response to the next succeeding RF input pulse, with such next succeeding video frequency pulse having an amplitude within a predetermined amount (such as ±0.5 dB) of its nominal amplitude when the first RF input pulse is not present. Recovery time monotonically increases with increasing power levels and pulse widths (of up to about 10 μsec) of the input RF pulses—that is, recovery time increases as such power levels and/or pulse widths increase. It is noted that due to the presence of directional coupler 28 (here, a 20 dB coupler), the RF power applied to second RF detector 22 is between −60 dBm and 0 dBm for corresponding RF power levels from −40 dBm to +20 dBm at DLVA input port 12. It has been found that preventing the RF power level applied to a DLVA RF detector from exceeding 0 dBm provides recovery times at or below 0.5 micro-second (≦0.5 μsec) for substantially any RF input signal pulse width. Here 20 dB coupler 28 so restricts the RF power levels applied to second RF detector 22, for the present input signal range of −40 dBm to +20 dBm, as discussed above. However, neglecting for a moment the presence of quasi-active limiter 24 and ignoring the relatively insignificant insertion loss of the low loss arm of coupler 28 (approximately 1.5 dB), a little thought reveals that as RF power at DLVA input port 12 increases from −40 dBm to +20 dBm, the RF power of the signal coupled to first RF detector 20 would correspondingly rise from −40 dBm to +20 dBm resulting in DLVA recovery times of up to 10 μsec, which are unsatisfactory in some applications.

Figure 2:
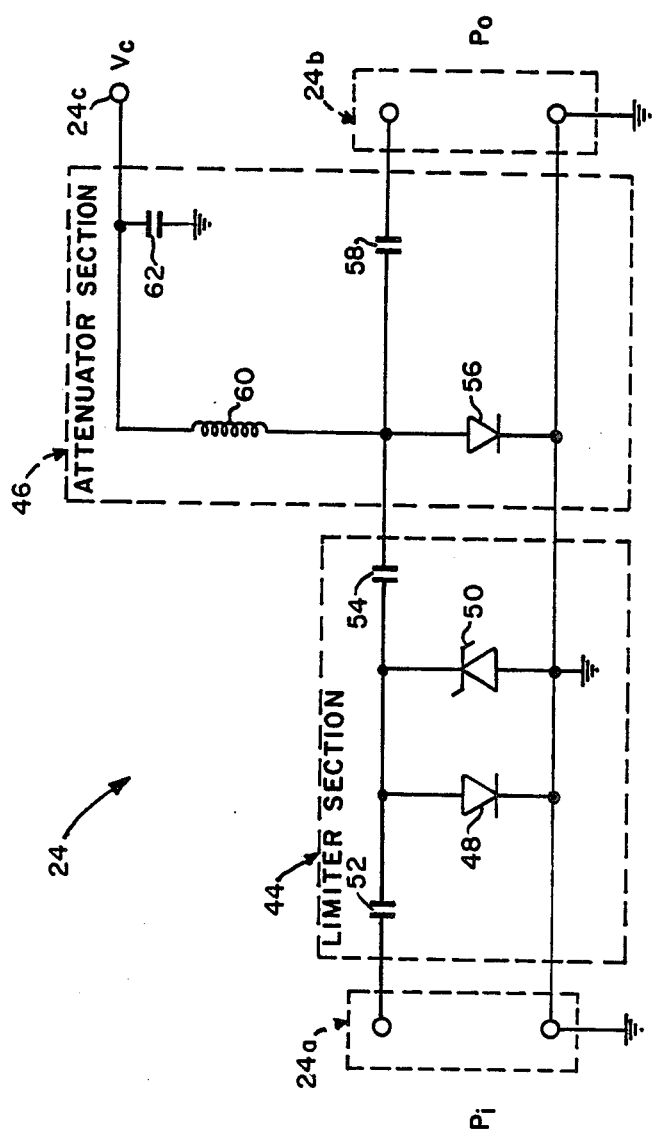
FIG. 2 is a schematic diagram of one of the components of FIG. 1.

Thus, the present invention provides quasi-active limiter 24 responding to a control signal produced by control feedback circuit 26 in response to the output of second RF detector 22 (via amplifiers 36a–36c) to attenuate the power level of the RF signal coupled to first RF detector 20 below a predetermined level (here, 0 dBm) as the power level of the RF signal at DLVA input port 12 equals the predetermined level, and to further attenuate and limit the power level of the RF signal coupled to first RF detector 20 from exceeding the predetermined power level as the power level of the RF signal at input port 12 exceeds said predetermined level. Quasi-active limiter 24, shown schematically in FIG. 2, comprises limiter section 44 and attenuator section 46, coupled as shown between RF input and output terminals 24a, 24b, respectively thereof. It is noted that terminals 24a, 24b are each shown as a pair of terminals in FIG. 2—a signal port and a grounded port—it being understood that RF transmission lines are used in DLVA 10. The grounded shields of such transmission lines are omitted from FIG. 1 for the sake of clarity. RF input terminal 24a is fed by DLVA input port 12 via the throughput arm of coupler 28 (FIG. 1), and RF output terminal 24b is coupled to the input of first RF detector 20. Limiter section 44 comprises parallel-coupled PIN diode 48 and Schottky diode 50. The anode of PIN diode 48 and cathode of Schottky diode 50 are coupled together and to the signal port of RF input terminal 24a via capacitor 52 (here 22 pF) and further are coupled through capacitor 54 (here 22 pF) to attenuator section 46. The cathode of PIN diode 48 and anode of Schottky diode 50 are grounded. Attenuator section 46 comprises an additional PIN diode 56 having an anode coupled to capacitor 54 and to the signal port of RF output terminal 24b via capacitor 58 (here 22 pF). The cathode of PIN diode 56 is grounded. The anode of PIN diode 56 is additionally coupled through inductor 60 to control signal input terminal 24c, and a capacitor 62 (here 20 pF) is coupled between terminal 24c and ground, as shown. Diodes 48, 50, 56 here are commercially available devices manufactured by Alpha Industries of Woburn, Mass. 01801, PIN diodes 48, 56 being part nos. CLA 3134-01 and Schottky diode 50 is part no. CMB 7601. The output of control feedback circuit 26 (FIG. 1) is applied to terminal 24c as a control or external biasing signal ($V_c$) for PIN diode 56, as discussed in detail hereinafter. Control feedback circuit 26 here comprises a pair of resistors 26a, 26b arranged as a voltage divider network, as shown. Resistor 26a, here approximately 909 ohms, is serially coupled between the output of amplifier 36c and terminal 24c of quasi-active limiter 24. Resistor 26b, here approximately 1000 ohms, is coupled from the junction of resistor 26a and terminal 24c to ground.

In operation, and referring also to FIG. 1, first RF detector 20 detects the power levels of RF signals at DLVA input port 12 within the first, −40 to −20 dBm range of power levels, and produces video frequency output signals representative of such detector power levels as has previously been discussed. Second RF detector 22, which is applied with power levels between −60 dBm and −40 dBm for such first range of power levels at input port 12, produces a very low video frequency output voltage at terminal 23 in response thereto. Thus, the output voltage of linear amplifier 36c is correspondingly slight, here less than 25 mV. Control feedback circuit 26 applies approximately half of this voltage to PIN diode 56 in quasi-active limiter 24, which is an insufficient external bias signal level to bring PIN diode 56 into conduction. The RF signal level at quasi-active limiter input 24a is itself insufficient to bias PIN diodes 48, 56 into conduction or to exceed the reverse breakdown voltage of zener diode 50. The RF signals between −40 dBm and −20 dBm thus are coupled through quasi-active limiter 24 to first RF detector 20 substantially unattenuated and non-limited (disregarding a 1 dB insertion loss contributed to by leakage current in diodes 48, 50, 56, and loss in the transmission lines and couplings). It is noted that inductor 60 and capacitor 62 form a low-pass filter, thereby preventing the high frequency RF signals (here between approximately 2 and 6 GHz) from being coupled from terminals 24a, 24b to terminal 24c and to the output of linear amplifier 36c.

For RF signals at DLVA input port 12 having power levels greater than −20 dBm (here, between −20 dBm and +20 dBm), second RF detector 22 (which sees such signals attenuated 20 dB by coupler 28) provides detection and produces video frequency output signals representative of such detected power levels, such output signals being amplified and applied to control feedback circuit 26, as has been discussed. As the power level at input port 12 increases from −20 dBm, the video frequency voltage produced by amplifier 36c and applied as a control signal to quasi-active limiter 24 by control feedback circuit 26 correspondingly increases. However, for DLVA input signal power levels equal to or below a predetermined level, here 0 dBm, the level of such video frequency control signal applied to quasi-active limiter 24 is insufficient to bias PIN diode 56 into conduction. Thus, and referring to Table I below, which lists control voltage level ($V_c$) and the power level of RF signals applied to first RF detector 20 ($P_o$) versus the power level (from −10 dBm to +20 dBm) of RF signals applied to DLVA input port 12 and input terminal 24a ($P_i$) at room temperature (+25° C.), DLVA input signals equal to or below 0 dBm are coupled unattenuated and non-limited (except for the above-discussed 1 dB insertion loss) to first detector 20 by quasi-active limiter 24.

TABLE I

| | (+25° C.) | |
|---|---|---|
| $P_i$ (dBm) | $V_c$ (mV) | $P_o$ (dBm) |
| −10.0 | 32 | −11.0 |
| −5.0 | 100 | −6.0 |
| −4.0 | 128 | −5.0 |
| −3.0 | 160 | −4.0 |
| −2.0 | 200 | −3.0 |
| −1.0 | 252 | −2.0 |
| 0.0 | 315 | −1.0 |
| +1.0 | 371 | −0.4 |
| +2.0 | 452 | 0.0 |
| +3.0 | 527 | −0.3 |
| +4.0 | 589 | −1.1 |
| +5.0 | 634 | −2.3 |
| +6.0 | 672 | −3.7 |
| +7.0 | 700 | −5.0 |
| +8.0 | 724 | −6.2 |
| +9.0 | 741 | −6.9 |
| +10.0 | 753 | −7.1 |
| +11.0 | 760 | −7.1 |
| +12.0 | 767 | −7.1 |
| +13.0 | 771 | −7.0 |
| +14.0 | 775 | −6.8 |
| +15.0 | 777 | −6.4 |
| +16.0 | 779 | −6.0 |
| +17.0 | 781 | −5.7 |
| +18.0 | 784 | −5.4 |
| +19.0 | 787 | −5.1 |
| +20.0 | 790 | −4.9 |

As shown in Table I, when DLVA input signal power exceeds 0 dBm (and reaches, for example, +1 dBm), the level of the control signal coupled by control feedback circuit 26 to PIN diode 56 becomes sufficient (for example 371 mV at +1 dBm) to externally bias PIN diode 56 into slight conduction. That is, while the level of the RF signal (e.g., +1 dBm) is not itself sufficient to bias PIN diode 56 (or PIN diode 48) into conduction, control feedback circuit 26 produces a control or external bias signal of sufficient level to bring PIN diode 56 into conduction. It is noted that such control signal is blocked by capacitor 54 from being applied to diodes 48, 50. The slight coduction of PIN diode 56 couples a small portion of the RF signal to ground, thereby introducing a small amount of attenuation in the RF signal coupled from terminal 24a to terminal 24b. For example, the aforementioned +1 dBm signal at terminal 24a is attenuated 0.4 dB by PIN diode 56 (and 1 dB by insertion loss) to −0.4 dBm at terminal 24b (and hence at the input to first RF detector 20, as shown in Table 1.

As the power level of the DLVA RF input signal further exceeds the predetermined, 0 dBm level, the video frequency voltage control signal produced by control feedback circuit 26 in response to the output of amplifier 36c further increases as well, as shown in Table I, here reaching about 790 mV at a DLVA input of +20 dBm. Thus, PIN diode 56 is driven harder into conduction as DLVA input power rises, coupling a greater portion of the RF signal to ground and introducing an increasing amount of attenuation in the RF signal coupled through quasi-active limiter 24 to first RF detector 20. It is noted that as PIN diode 56 becomes increasingly conducting the impedance thereof decreases, changing the voltage division produced by control feedback circuit 26 (since resistor 26b and PIN diode 56 are in parallel). The values of resistors 26a, 26b are selected with this in mind and also to prevent the power level applied to first RF detector from exceeding the predetermined level (here 0 dBm). The selection of the resistances of 909 and 1K ohms for resistors 26a, 26b, respectively, here results in a maximum RF power level of 0 dBm being applied to first RF detector 20 when the DLVA input signal power at terminal 24a is +2 dBm, as shown in Table I.

PIN diode 56 is fully conducting when the control signal level is about 750 mV which, as shown in Table I, occurs with a DLVA input signal power of about +10 dBm. At this point, PIN diode 56 in attenuator section 46 is imparting its maximum attenuation, about 15 dB, to the RF signal coupled to first RF detector 20, and will continue to apply about 15 dB of attenuation as DLVA input signal power increases to +20 dBm. However, PIN diode 48 in limiter section 44 begins conducting in response to the RF signal at terminal 24a when DLVA input signal power equals a second predetermined level (here about +5 dBm) to limit the power level of RF signals applied to PIN diode 56. That is, RF signals coupled to terminal 24a from DLVA input port 12 drive PIN diode 48 into conduction when such signals equal or exceed +5 dBm. Schottky diode 50, when sufficiently reversed-biased by the RF signal, maintains a reference voltage across PIN diode 48 to aid the forward conductance thereof. As DLVA input signal power increases from +5 dBm to +20 dBm, PIN diode 48 is driven harder into conduction. Thus, PIN diode 48 "limits" the power level of RF signals coupled through limiter section 44 to attenuator section 46 in response to the power of RF signals applied to terminal 24a exceeding +5 dBm. For example, a DLVA input signal of +20 dBm at terminal 24a biases PIN diode 48 into significant conduction, with such PIN diode 48 limiting the power level of such signal coupled to attenuator section 46 to about +10 dBm. The above-discussed 15 dB attenuator introduced by PIN diode 56 at such a DLVA input signal power level further attenuates the RF signal from limiter section 44 to a power level of about −4.9 dBm at terminal 24b (and hence at the input of first RF detector 20), as shown in Table I.

Figure 3:
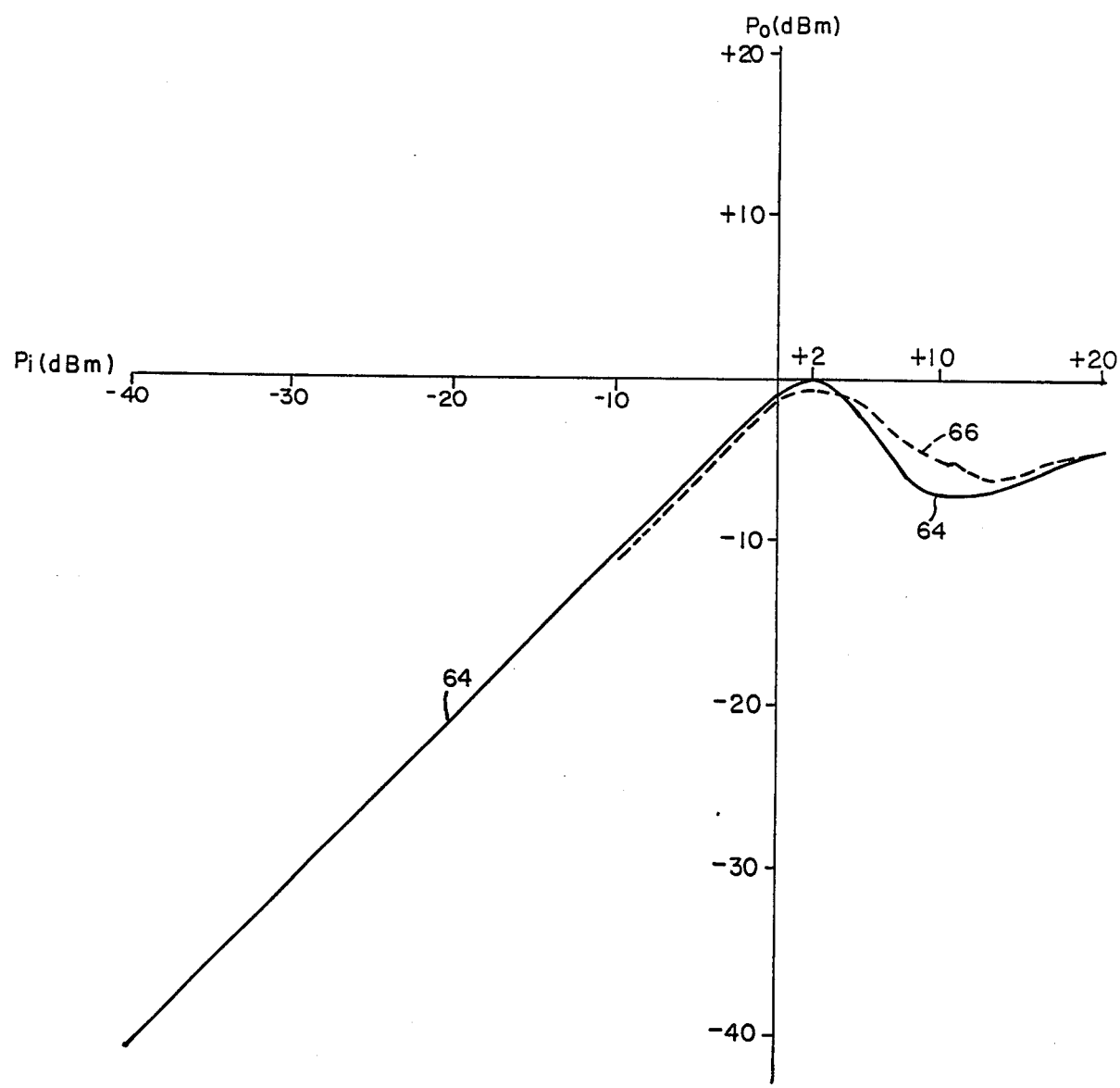
FIG. 3 is a graph useful in understanding the operation of the DLVA of FIG. 1.

In summary, and referring now to FIG. 3, the RF power of signals coupled to first detector 20 ($P_o$) over the operating range (i.e., −40 dBm to +20 dBm) of DLVA 10 at room temperature (+25° C.) is shown as trace 64. The power levels of signals coupled to first RF detetor 20 is linearly proportional to the power levels of DLVA input signals between −40 dBm and 0 dBm. At a predetermined input signal power (here 0 dBm), attenuator section 46 (specifically, PIN diode 56) begins attenuating the RF signal coupled to first RF detector 20 in response to the video frequency control signal ($V_c$) produced by control feedback circuit 26. The power level of the signal coupled to first RF detector 20 here reaches a maximum of 0 dBm at a DLVA input signal power of +2 dBm, and then begins to decline with increasing DLVA input signal power. At a second predetermined DLVA input signal level (here +5 dBm) limiter section 44 (specifically, PIN diode 48 and zener diode 50) begins limiting the power of the RF signal coupled to attenuator section 46 in response to the power level of the DLVA input signal itself. The RF signal coupled to first RF detector here reaches a minimum level of −7.1 dBm for DLVA input signal levels between +10 dBm and +12 dBm and then slowly rises to −4.9 dB for DLVA input signal at +20 dBm.

Thus, with the present invention, a DLVA 10 is provided wherein the RF power level of signals applied to first detector 20 is maintained below a predetermined level (here 0 dBm) over the entire input signal range (here, −40 dBm to +20 dBm) over which DLVA 10 operates. Thus, it has been found that such DLVA 10 has a recovery time of less than 500 nanoseconds (nsec), even as low as 300 nsec, for RF input signals having even the maximum specified power (+20 dBm) and pulse widths of 1 μsec. Recovery time has been found to be maintained at less than 500 nsec with pulse widths of greater than 50 μsec. Such improved recovery times are achieved without the need of frequency compensating linear amplifiers 30a–30c, 36a–36c to change the frequency response thereof, or without disposing added preamplifiers and attenuators at the input of first RF detector 20 which can reduce the "flatness" of video frequency output signal and increase the DLVA's current consumption.

An additional feature of the present invention is the relative insensitivity of the feedback arrangement of circuit 26 and quasi-active limiter 24 to variations, such as increases, in temperature without the need for temperature compensation circuitry. For example, Table II lists the control voltage levels ($V_c$) produced by control feedback circuit 26 and the RF power coupled to first RF detector 20 ($P_o$) in response to power levels, between −10 to +20 dBm, of DLVA input signals at terminal 24a ($P_i$) at a temperature of +85° C.

TABLE II

| $P_i$ (dBm) | (+85° C.) $V_c$ (mV) | $P_o$ (dBm) |
|---|---|---|
| −10.0 | 17 | −11.2 |
| −5.0 | 85 | −6.2 |
| −4.0 | 113 | −5.1 |
| −3.0 | 144 | −4.2 |
| −2.0 | 184 | −3.2 |
| −1.0 | 234 | −2.2 |
| 0.0 | 291 | −1.3 |
| +1.0 | 338 | −0.76 |
| +2.0 | 397 | −0.44 |
| +3.0 | 448 | −0.54 |
| +4.0 | 493 | −0.97 |
| +5.0 | 513 | −1.66 |
| +6.0 | 567 | −2.55 |
| +7.0 | 592 | −3.34 |
| +8.0 | 614 | −4.06 |
| +9.0 | 630 | −4.63 |
| +10.0 | 644 | −5.10 |
| +11.0 | 655 | −5.22 |
| +12.0 | 666 | −5.94 |
| +13.0 | 675 | −6.17 |
| +14.0 | 683 | −6.20 |
| +15.0 | 689 | −6.03 |
| +16.0 | 695 | −5.77 |
| +17.0 | 701 | −5.54 |
| +18.0 | 707 | −5.33 |
| +19.0 | 714 | −5.14 |
| +20.0 | 720 | −4.96 |

Comparison of Table II with Table I (which lists the same data taken at +25° C.) reveals that the power levels ($P_o$) of signals applied to first RF detector 20 at +85° C. closely track the power levels ($P_o$) of such signals at +25° C. This correlation is illustrated in FIG. 3, with trace 66 representing $P_o$ at +85° C. Referring also to FIG. 1, diodes 35a, 35a', 35b, 35b' clamp the output of amplifiers 36a, 36b, respectively, at nominal levels at room temperature in accordance with the nominal forward conducting voltages of such diodes (about 0.7 volts) at room temperature. As temperature increases, the clamped output voltages of linear amplifiers 36a, 36b decrease due to a corresponding reduction in the forward conducting voltage at which Schottky transistors 35a, 35a', 35b, 35b' conduct (that is, such transistors 35a, 35a'; 35b, 35b' clamp the outputs of amplifiers 36a, 36b, respectively, at progressively lower voltages as temperature increases). Thus, the output of linear amplifier 36c also decreases with increasing temperature, with control feedback circuit 26 coupling a correspondingly lower control signal voltage to quasi-active limiter 24, as shown in Table II. However, PIN diode 56 also requires a reduced external bias signal level at such higher temperatures (e.g., +85° C.) than at room temperature to produce a given amount of attenuation, since the forward bias voltage thereof also decreases with increasing temperature. Thus, while the control voltage level ($V_c$) decreases with increasing temperature, such decreased voltage level forward biases PIN diode 56 to substantially the same level of conduction as the higher control voltage level at room temperature, with PIN diode 56 thereby applying substantially the same amount of attenuation to the RF signal coupled to first RF detector 20 at elevated temperatures (e.g., +85° C.) as at room temperature, as shown in Tables I, II and FIG. 3. Here, the attenuation correlation over temperature is further improved by selecting clamping diodes 35a, 35a', 35b, 35b' having substantially the same temperature response as PIN diode 56. Here, such clamping diodes 35a, 35a', 35b, 35b' are 1N5711 diodes. It has been found that a pair of such diodes have substantially the same temperature response as PIN diode 56 (here a CLA 3134-01).

Having described a preferred embodiment of the present invention, alterations and modifications thereof may become apparent to those skilled in the art. For example, while control feedback circuit 26 has been described as a resistive divider network continuously applying a portion of the output of linear amplifier 36c as an external biasing control signal for attenuating PIN diode 56, feedback circuit 26 may alternately comprise a comparator for applying a binary control signal having a first, low level (e.g., 0 VDC) to PIN diode 56 when the output of amplifier 36c is below a predetermined threshold voltage and a second, high level (e.g., approximately 0.67 VDC) to PIN diode 56 when the output of amplifier 36c exceeds the threshold voltage. The threshold voltage would be selected to equal the output of amplifier 36c at a predetermined DLVA RF input signal power (such as 0 dBm). Thus, PIN diode 56 is nonconducting for DLVA input signals below 0 dBm and fully conducting for DLVA input signals from 0 dBm to 20 dBm, thereby introducing a predetermined amount of attenuation (such as 10 dB) to RF signals coupled to first RF detector 20 for DLVA input signals between 0 dBm and +20 dBm and no attenuation for DLVA input signals below 0 dBm. As has been discussed above, PIN diode 48 increasingly limits the RF signal level coupled to PIN diode 56 at DLVA input signals between +5 dBm and +20 dBm. Thus, the RF signal coupled to first RF detector 20 is attenuated and limited to be maintained below the predetermined, 0 dBm power level for DLVA input signals over the entire input signal power range (e.g., −40 dBm to +20 dBm) over which DLVA 10 operates. It is noted that such comparator must be a relatively high speed device due to the high frequency of the DLVA input signals. Here, with input signals in the range of 2–6 GHz, a model AM686HM comparator manufactured by Advanced Micro Devices of Sunnyvale, Calif. 94086, has been found to have a sufficiently high operating speed. Thus, it is understood that the present invention is to be limited solely by the scope of the appended claims.

What is claimed:

1. In combination:
   a pair of radio frequency detectors having input terminals coupled to an input port;
   means, responsive to an output of a second one of the pair of detectors, for producing a control signal in accordance with the power level of a radio frequency signal at the input port; and
   means, disposed between the input port and the input terminal of a first and second ones of the pair of detectors, for coupling a first portion of the radio frequency signal at the input port to the input terminal of the first one of the pair of detectors and for coupling a second portion of the radio frequency signal at the input port to the input port of the second one of the pair of detectors, said coupling means being responsive to said control signal for attenuating the level of such radio frequency signal coupled to the input terminal of the first one of the pair of detectors below a predetermined power level as the level of the radio frequency signal at the input port equals or exceeds the predetermined power level.

2. The combination of claim 1 wherein the attenuating means further comprises means, responsive to the power level of the radio frequency signal at the input port, for limiting the power level of the radio frequency signal coupled to the attenuating means as the power level of the radio frequency signal at the input port equals or exceeds a second predetermined level.

3. The combination of claim 2 wherein the limiting means comprises a first diode and the attenuating means comprises a second diode electrically coupled to the first diode, said first and second diodes having the radio frequency signal coupled to first electrodes thereof and having second electrodes coupled to a reference potential.

4. The combination of claim 3 wherein the first and second diodes are PIN diodes and the limiting means also comprises a Schottky diode electrically coupled in parallel with the first PIN diode.

5. The combination of claim 4 wherein the attenuating means further comprises means for electrically coupling the control signal to the second PIN diode and the limiting means further comprises means for electrically decoupling the control signal from the first PIN diode and the Schottky diode.

6. The combination of claim 5 further comprising:
   an amplifier coupled between the output of the second one of the pair of detectors and the control signal producing means; and
   diode means, coupled between an output of the amplifier means and the reference potential, for clamping a signal at the output of the amplifier at a nominal level, in accordance with a nominal conducting voltage of said diode means, at room temperature.

7. The combination of claim 6 wherein the second PIN diode has a nominal conducting voltage at room temperature varying from the nominal level thereof in a predetermined manner in accordance with temperature variations, and wherein said diode means is selected to have a conducting voltage varying in substantially the predetermined manner from the nominal level thereof in accordance with said temperature variations.

8. The combination of claim 1 wherein the control signal producing means comprises a voltage divider network, an input of the voltage divider network being fed by the output of the second one of the pair of detectors and an output of the voltage divider network being coupled to the attenuating means.

9. The combination of claim 8 wherein the voltage divider network comprises a first resistor serially coupled at a first end to the output of the second one of the pair of detectors and at a second end to the attenuating means, and a second resistor coupled between the second end of the first resistor and a reference potential.

10. The combination of claim 1 wherein the control signal producing means comprises:
    means for comparing the output of the second one of the pair of detectors with a threshold signal and for producing the control signal with a first level when the threshold signal exceeds the output of the second one of the pair of detectors and with a second level when the output of the second one of the pair of detectors equals or exceeds the threshold signal; and
    said attenuating means attenuating the radio frequency signal coupled to the first one of the pair of detectors by a predetermined amount in response to the second level of the control signal and introducing substantially no attenuation in said radio frequency signal in response to the first level of the control signal.

11. In combination:
    means for receiving a radio frequency signal and for producing a corresponding video frequency output signal having an amplitude logarithmically proportional to the power level of such received radio frequency signal, said producing means comprising:
    (i) first means, responsive to the received radio frequency signal coupled thereto having a power level within a first range of power levels, for detecting such radio frequency signal and producing a first signal representative of the power level of said radio frequency signal; and
    (ii) second means, responsive to the received radio frequency signal coupled thereto having a power level within a second range of power levels, for detecting said radio frequency signal and producing a second signal representative of the power level of such radio frequency signal, the power levels within the second range exceeding the power levels in the first range;
    means, responsive to the second signal, for producing a control signal having levels in accordance with the power level of the received radio frequency signals; and
    means, responsive to the control signal, for attenuating the received radio frequency signal when it has a power level equal to or exceeding a predetermined level.

12. The combination of claim 11 wherein the attenuating means further comprises means, responsive to the power levels of received radio frequency signals exceeding a second predetermined power level, for limiting the power levels of received radio frequency signals coupled to the attenuating means in accordance with the power levels of the received radio frequency signals exceeding the second predetermined level.

13. The combination of claim 12 wherein the second predetermined power level exceeds the first predetermined power level.

14. The combination of claim 12 wherein the limiting means comprises a first diode having a first electrode fed by received radio signals and a second electrode coupled to a reference potential, and the attenuating means comprises a second diode having first and second electrodes electrically coupled to the first and second electrodes, respectively, of the first diode.

15. The combination of claim 14 wherein the attenuating means further comprises means for electrically coupling the control signal to the first electrode of the second diode and the limiting means comprises means for electrically decoupling the control signal from the first electrode of the first diode.

16. The combination of claim 15 wherein the control signal producing means comprises a resistor network comprising:
- a first resistor serially coupled between an output of the second detecting means and the first electrode of the second diode; and
- a second resistor coupled in parallel with the second diode.

17. The combination of claim 16 wherein the first and second diodes are PIN diodes.

18. In combination:
- input port means for receiving a radio frequency signal having a power level within a range, such range comprising a first sub-range and a second sub-range, the power levels in the second sub-range exceeding the power levels in the first sub-range;
- first detector means for detecting the power level of the received radio frequency signal when it has a power level within the first sub-range and for producing a corresponding first video frequency signal having an amplitude representative of such detected power level;
- second detector means for detecting the power level of the received radio frequency signal when it has a power level within the second sub-range and for producing a corresponding second video frequency signal having an amplitude representative of such detected power level;
- means for producing a control signal, such control signal having a level in accordance with the power level of received radio frequency signal;
- means, responsive to the control signal, for attenuating the received radio frequency signal having a power level equal to or exceeding a first predetermined level in accordance with the level of the control signal, and for coupling such attenuated radio frequency signal to the first detector means; and
- means, responsive to the power level of the received radio frequency signal exceeding a second predetermined power, for limiting the power level of the received radio frequency signal coupled to the attenuating means in accordance with the power levels of the received radio frequency signal exceeding the second predetermined level.

19. The combination of claim 18 further comprising: means, responsive to the first video frequency signals, for producing corresponding video frequency output signals having amplitudes proportional to the logarithms of the power levels of corresponding received radio frequency signals within the first range of power levels, and responsive to the second video frequency signals for producing corresponding video frequency output signals having amplitudes proportional to the logarithms of the power levels of corresponding received radio frequency signals within the second range of power levels.

20. The combination of claim 19 wherein the limiting means comprises a first PIN diode having a first electrode fed by received radio signals and a second electrode coupled to a reference potential, and the attenuating means comprises a second PIN diode having first and second electrodes electrically coupled to the first and second electrodes, respectively, of the first PIN diode.

21. The combination of claim 20 wherein the attenuating means further comprises means for electrically coupling the control signal to the first electrode of the second PIN diode and the limiting means comprises means for electrically decoupling the control signal from the first electrode of the first PIN diode.

22. The combination of claim 21 wherein the control signal producing means comprises a resistor network comprising:
- a first resistor serially coupled between an output of the second detecting means and the first electrode of the second PIN diode; and
- a second resistor coupled in parallel with the second PIN diode.

23. The combination of claim 20 further comprising:
- an amplifier coupled between an output of the second detector means and the control signal producing means; and
- diode means, coupled between an output of the amplifier means and the reference potential, for clamping a signal at the output of the amplifier at a nominal level, in accordance with a nominal conducting voltage of said diode means, at room temperature.

24. The combination of claim 23 wherein the second PIN diode has a nominal conducting voltage at room temperature varying from the nominal level thereof in a predetermined manner in accordance with temperature variations, and wherein said diode means is selected to have a conducting voltage varying in substantially the predetermined manner from the nominal level thereof in accordance with said temperature variations.

25. A detector log video amplifier comprising:
- a detector log video amplifier section having a radio frequency signal coupled thereto from an input port;
- means for detecting a portion of the radio frequency signal at the input port and producing a control signal in accordance with the power level of such portion of the radio frequency signals; and
- means, responsive to the control signal, for attenuating the radio frequency signal coupled to the detector log video amplifier section below a predetermined power level as the power level of the radio frequency signal at the input port equals or exceeds the predetermined power level.

* * * * *